(12) United States Patent
Hideo et al.

(10) Patent No.: US 6,325,849 B1
(45) Date of Patent: Dec. 4, 2001

(54) P-TYPE GAAS SINGLE CRYSTAL AND METHOD FOR MANUFACTURING THE SAME

(75) Inventors: Fujisawa Hideo; Katano Kizuku; Yamamoto Osamu, all of Ushiku (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 09/348,686

(22) Filed: Jul. 7, 1999

(30) Foreign Application Priority Data

Jul. 7, 1998 (JP) .................................................. 10-191531

(51) Int. Cl.[7] .................................................. C30B 11/04
(52) U.S. Cl. ................. 117/82; 117/83; 117/84; 117/956; 252/62.36 A
(58) Field of Search .................... 117/82, 83, 84, 117/956; 252/62.36 A

(56) References Cited

U.S. PATENT DOCUMENTS

| | | | |
|---|---|---|---|
| 5,376,583 | * 12/1994 | Northrup et al. | 437/133 |
| 5,436,194 | * 7/1995 | Kondo et al. | 437/129 |
| 6,072,817 | * 6/2000 | Adachi et al. | 372/45 |
| 6,081,541 | * 6/2000 | Adachi et al. | 372/45 |

OTHER PUBLICATIONS

European Search Report dated Oct. 15, 1999.
Patent Abstract of Japan: Pub. No. 58176200; Pub. Date: Oct. 15, 1983.

"Low Dislocation Density 3–inch Si doped GaAs Crystals by Vertical Boat Growth", Y. Hagi, et al. Semiconducting and Insulating Materials 1996. Proceedings of the 9T Conference (SIMC), Apr. 29–May 3, 1996, pp. 279–282.

Patent Abstract of Japan: Pub. No. 59137400; Pub. Date: Aug. 7, 1984.

Patent Abstract of Japan: Pub. No. 04139098; Pub. Date: May 13, 1992.

Patent Abstract of Japan: Pub. No. 61136997; Pub. Date: Jun. 24, 1986.

DE 40 21 252 A (Hitachi Cable) Jan. 9, 1992. In German, with no Translation.

DE 196 38 583 A (Kernforschungsanlage Juelich) Apr. 2, 1998. In German with no translation.

* cited by examiner

Primary Examiner—Robert Kunemund
(74) Attorney, Agent, or Firm—David G. Conlin; John B. Alexander; Dike, Bronstein, Roberts & Cushman IP Group

(57) ABSTRACT

Disclosed are a P-type GaAs single crystal having an average dislocation density of 500 $cm^{-2}$ or lower, and a manufacturing method therefor. The P-type GaAs single crystal is characterized by containing, as dopants, Si at an atomic concentration of from $1 \times 10^{17}$ to $1 \times 10^{19}$ $cm^{-3}$ and Zn at an atomic concentration of from $2 \times 10^{18}$ to $6 \times 10^{19}$ $cm^{-3}$. Further, as another example, B is contained at an atomic concentration of from $1 \times 10^{17}$ to $1 \times 10^{20}$ $cm^{-3}$.

23 Claims, 4 Drawing Sheets

FIG. 2

| | Solidifying Ratio | Carrier Concentration ($cm^{-3}$) | Zn Concentration in crystal (atoms × $cm^{-3}$) | Si Concentration in crystal (atoms × $cm^{-3}$) | B Concentration in crystal (atoms × $cm^{-3}$) | Average dislocation density (count × $cm^{-2}$) | Zn/Si | B/Si |
|---|---|---|---|---|---|---|---|---|
| Embodiment 1 | 0.5 | $1.2 \times 10^{19}$ | $1.4 \times 10^{19}$ | $2.3 \times 10^{18}$ | $4.0 \times 10^{18}$ | 180 | 6.09 | 1.74 |
| Embodiment 2 | 0.5 | $1.5 \times 10^{19}$ | $1.7 \times 10^{19}$ | $4.2 \times 10^{18}$ | | 380 | 4.05 | |
| Embodiment 3 | 0.5 | $2.1 \times 10^{19}$ | $2.2 \times 10^{19}$ | $3.5 \times 10^{18}$ | | 420 | 6.29 | |
| Comparison Example 1 | 0.5 | $2.0 \times 10^{19}$ | $2.1 \times 10^{19}$ | $8.0 \times 10^{16}$ | | 1800 | 263 | |
| Comparison Example 2 | 0.5 | $0.9 \times 10^{19}$ | $1.5 \times 10^{19}$ | $1.1 \times 10^{19}$ | | 2840 | 1.36 | |

P-TYPE GAAS SINGLE CRYSTAL AND METHOD FOR MANUFACTURING THE SAME

BACKGROUND OF THE INVENTION

1. Field of the Invention

The present invention relates to a P-type GaAs single crystal having low dislocation, and a manufacturing method therefor.

2. Related Arts

P-type GaAs single crystals have been widely used as sliced and epitaxially grown for use in manufacturing a compound semiconductor laser or a light-emitting diode (LED).

It is well known that the P-type GaAs single crystals widely used for compound semiconductor lasers and LEDs can be manufactured using various methods, such as the horizontal Bridgman (HB) method, the horizontal gradient freeze (GF) method, the liquid encapsulated crystal growth (LEC) method, the vertical Bridgman (VB) method, and the vertical gradient freeze (VGF) method.

Since high light emission efficiency and long service life are requisite qualities for a compound semiconductor laser, a P-type GaAs single crystal having a lower dislocation density is required. Therefore, generally, the horizontal Bridgman (HB) method, the gradient freeze (GF) method, the vertical Bridgman (VB) method, or the vertical gradient freeze (VGF) method is employed to manufacture a P-type GaAs single crystal.

However, when using any of these methods, the average dislocation density is equal to or greater than 1000 cm$^{-2}$, and it is difficult to obtain a high yield when manufacturing P-type GaAs single crystals having an average dislocation density of 500 cm$^{-2}$ or lower.

On the contrary, it is known that doping a crystal with S and Si can effectively reduce dislocation, However, in this case, only an N-type GaAs single crystal is obtained.

As example means for resolving the above shortcomings, doping GaAs crystal with Zn and S using the horizontal Bridgman (HB) method is described in Japanese Unexamined Patent Publication No. Sho 63-57079. However, although a P-type GaAs single crystal having an average dislocation density of 1000 cm$^{-2}$ or lower can be obtained using this method, it is difficult to manufacture a P-type GaAs single crystal having an average dislocation density of 500 cm$^{-2}$.

It has been reported that In, which is a neutral impurity, can contribute to the reduction of the dislocation of GaAs crystal (Proc. 12th Intern. Symp. on GaAs and Related Compounds, London-Bristol, 1986, p. 7–2). As related in this report, a 2-inch GaAs wafer which was doped with Zn, at a density of 1.5×10$^{19}$ cm$^{-3}$, and In, at a density of 4.0×10$^{19}$ cm$^{-3}$, served as a semiconductor wafer having no dislocation.

However, since the segregation coefficient of In is small, i.e., 0.1, in order to perform the high density doping of a crystal with In, a single crystal must be manufactured from melt-GaAs to which a large amount of In has been added in advance. However, if a crystal is manufactured under these conditions, cell growth is begun due to constitutional supercooling during the solidifying of the crystal, and there is a considerable reduction in productivity.

SUMMARY OF THE INVENTION

It is, therefore, one objective of the present invention to provide a P-type GaAs single crystal which resolves the conventional problems, and a manufacturing method therefor.

It is another objective of the present invention to provide a P-type GaAs single crystal having an average dislocation density of 500 cm$^{-2}$.

To achieve the above objectives, according to the present invention, provided is a P-type GaAs single crystal containing Si and a P-type indicative dopant at an atomic ratio, for said P-type indicative dopant to Si, of 1.5 to 200, or preferably 2 to 100.

Further, relative to Si, B and/or S is contained as a dopant at an atomic ratio of 0.001 to 1000. Therefore, since the contained dopant has an atomic concentration of 1×10$^{17}$ to 1×10$^{20}$ cm$^{-3}$, a P-type GaAs single crystal having a lower dislocation can be obtained.

In addition, a carrier concentration is 1×10$^{18}$ to 5×10$^{19}$ cm$^{-3}$.

The average dislocation density of such a P-type GaAs single crystal can be equal to or lower than 500 cm$^{-2}$.

Furthermore, at least one part of the Si can be replaced by Se and/or Te.

The doping method is not limited to the use of any of the above dopants. A doping source can be, for example, a metal, a compound, an oxide, or an impurity in polycrystal or in a container, and can take the form of a solid, a liquid or a gas.

To manufacture the above described P-type GaAs single crystal, an Si dopant and a P-type indicative dopant for a P-type GaAs single crystal are respectively loaded in a deposition container at a density of from 1×10$^{17}$ to 5×10$^{19}$ cm$^{-3}$ and at a density of from 1×10$^{18}$ to 5×10$^{20}$ cm$^{-3}$, so that the atomic ratio of the P-type indicative dopant relative to Si ranges from greater than 1 to equal to or smaller than 1000, in particular, 1.1 to 500. Thus, the horizontal boat growth method or the vertical boat growth method can be employed.

Other features and effects of the present invention will become apparent during the course of the descriptions given for the following embodiments of the present invention.

BRIEF DESCRIPTION OF THE DRAWINGS

FIG. 2 is a table showing measured figures of embodiments and comparisons.

DETAILED DESCRIPTION OF THE PREFERRED EMBODIMENTS

Figure 1:
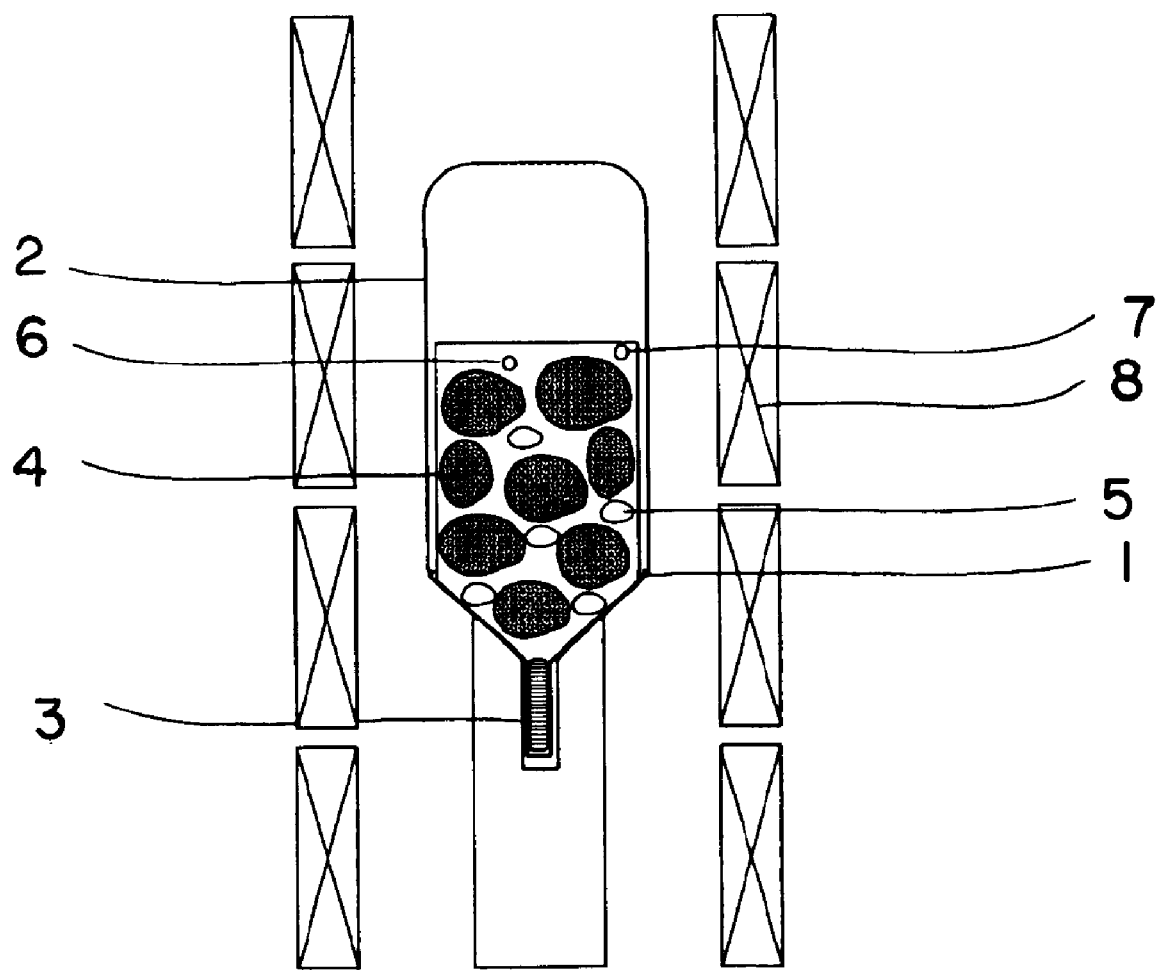
FIG. 1 is a schematic diagram illustrating an apparatus used to manufacture a single crystal according to a first embodiment of the present invention.

The preferred embodiments of the present invention will now be described in detail while referring to the accompanying drawings. As previously described, a P-type GaAs single crystal which has been grown is sliced and is used for an epitaxial semiconductor wafer. In the explanation for the present invention, except where otherwise specified, the meanings of terms for the P-type GaAs single crystal and the scope of the present invention include those for a P-type GaAs single crystal which has been grown and a P-type GaAs single crystal semiconductor wafer which has been prepared as a substrate by slicing the P-type GaAs single cristal.

The present inventor has sutudied the above described problem, which is present in the prior art. As a result, it has been found that when the doping with Si and a P-type indicative dopant of a GaAs single crystal is doubled, in particular when both dopants are present at a specific ratio, i.e., at an atomic ratio of the P-type indicative dopant to Si ranging from 1.5 to 200, preferably 2 to 200 and even more preferably 2 to 50, Si effectively restricts the dislocation movement, and a P-type GaAs single crystal having low dislocation can be obtained. Normally, when the densities established for Si and a P-type indicative dopant, such as an impurity, fall within a predetermined range, a P-type GaAs single crystal can be manufactured which has a preferable, average dislocation density.

According to one embodiment of the present invention, since as an impurity the Si content fell in an atomic range of from $1 \times 10^{17}$ to $5 \times 10^{19}$ cm$^{-3}$, in particular, from $1 \times 10^{17}$ to $1 \times 10^{19}$ cm$^{-3}$, and a P-type dopant content fell in an atomic range of from $1.1 \times 10^{17}$ to $1 \times 10^{20}$ cm$^{-3}$, in particular, from $1 \times 10_{18}$ to $1 \times 10^{20}$ cm$^{-3}$, preferably from $2 \times 10^{18}$ to $6 \times 10^{19}$ cm$^{-3}$, more preferably, from $2 \times 10^{18}$ to $5 \times 10^{19}$ cm$^{-3}$, a P-type GaAs single crystal having a low dislocation density was obtained.

When the Si atomic concentration is equal to or higher than $1 \times 10^{18}$ cm$^{-3}$, greater low dislocation effects can be obtained. Further, if the Si atomic concentration exceeds $1 \times 10^{19}$ cm$^{-3}$, a tiny deposited substance tends to be generated due to an impurity, and cell growth induced by constitutional supercooling is begun. Therefore, as an impurity, a practical Si atomic concentration content ranges from $1 \times 10^{18}$ to $1 \times 10^{19}$ cm$^{-3}$.

Generally, one element is selected as a P-type dopant from among a group consisting of C, Be, Zn, Cd, Li, Ge, Au, Mn, Ag, Pb, Co, Ni, Cu and Fe. Zn is the element which is most preferred.

In particular, Zn is preferable because, if its content ranges from $2 \times 10^{18}$ to $6 \times 10^{19}$ cm$^{-3}$, constitutional supercooling seldom occurs during crystal growth, and a low dislocation density can be obtained. When the atomic concentration exceeds $6 \times 10^{19}$ cm$^{-3}$, constitutional supercooling tends to occur during crystal growth and the manufacturing yield tends to be reduced.

It is preferable that the carrier concentration be from $1 \times 10^{18}$ cm$^{-3}$ to $5 \times 10^{19}$ cm$^{-3}$ for the P-type semiconductor wafer.

For manufacturing a P-type GaAs single crystal having an average dislocation density which is equal to or lower than 500 cm$^{-2}$, according to the present invention only the Si and P-type dopant need be double doped, as is described above. However, in order to manufacture a single crystal having a lower dislocation density, it is preferable that B and/or S be contained at an atomic ratio relative to Si which ranges from 0.001 to 1000, in particular, 0.001 to 100, or more preferably 0.05 to 50. Generally, the B and/or S atomic concentration content ranges from $1 \times 10^{17}$ to $1 \times 10^{20}$ cm$^{-3}$, and preferably from $1 \times 10^{18}$ to $5 \times 10^{19}$ cm$^{-3}$.

Further, either a horizontal boat method, such as the horizontal Bridgman (HB) method or the horizontal gradient freeze (GF) method, or a vertical boat method, such as the vertical Bridgman (VB) method or the vertical gradient freeze (VGF) method, may be employed as the method used for the manufacture of a P-type GaAs single crystal having an average dislocation density of 500 cm$^{-2}$ or lower.

According to the horizontal boat method (HB, GF), a horizontal (boat-shaped) deposition container is employed, and a seed crystal is positioned at one end of the container. Whereas, in accordance with the vertical boat method (VB or VGF), a vertically disposed long deposition container, similar to a crucible, is employed, and a seed crystal is positioned at the lower end.

Either method constitutes a P-type GaAs single crystal manufacturing method which comprises the steps of:

positioning a GaAs single seed crystal at one end of a deposition container, and positioning, in the deposition container, at least one part of a GaAs crystal growing material and a dopant;

heating the deposition container and its vicinity, and adjusting, in the deposition container, melt-GaAs in which the dopant is contained;

performing seeding; and cooling the deposition container in order to limit the growth of a P-type GaAs single crystal.

The feature of the present invention is that a dopant is so positioned in a deposition container that in a GaAs single crystal for the Si and the P-type indicative dopant the density content for the atomic ratio of the P-type indicative dopant relative to Si ranges from 1.5 to 200, as described above, and so that normally the Si and the P-type indicative dopant content densities respectively range from $1 \times 10^{17}$ to $5 \times 10^{19}$ cm$^{-3}$, and from $1 \times 10^{18}$ to $1 \times 10^{20}$ cm$^{-3}$. When Zn is employed as the P-type indicative dopant, it is preferable that the Zn content have a density of from $2 \times 10^{18}$ to $6 \times 10^{19}$ cm$^{-3}$.

When B and/or S is employed as a dopant, it is so disposed at a specific atomic ratio relative to Si of from 0.001 to 1000. Normally, B and/or S is disposed at the atomic concentration of from $1 \times 10^{17}$ to $1 \times 10^{20}$ cm$^{-3}$.

While the present invention is effective when applied for either the vertical or the horizontal boat growing method, its application for the vertical boat method is the most preferable because then the disk wafer manufacturing process can provide a high yield, larger wafers can be manufactured, and single crystals having a lower dislocation density can be produced.

According to the present invention, a large P-type GaAs single crystal semiconductor wafer can be fabricated for which the average dislocation density is equal to or lower than 500 cm$^{-2}$, the surface area (the dimensions for one face) is greater than 20 cm$^2$, the total surface area for both faces is grater than 40 cm$^2$, and the diameter exceeds 50.8 mm (2 inches), and is actually equal to or greater than 2.5 inches (the area equal to or greater than 31 cm$^2$ for one face) or 3 inches (the area equal to or greater than 45 cm$^2$ for one face).

A single crystal semiconductor wafer having a round shape can be efficiently fabricated by the above explained boat growing methods according to present invention. However, the present invention is not limited to obtain such the round shaped single crystal semiconductor wafer, and can be applied to other single crystal semiconductor wafers having any type of shapes such as square, as far as characteristics of the wafer is satisfied according to the present invention.

When at least one part of Si is replaced by doping with an impurity of Se and/or Te, the same effect can be also obtained as is obtained when using only Si.

As is described above, according to the present invention, a P-type GaAs single crystal having a low dislocation density can be obtained when a GaAs single crystal contains Si and a P-type dopant, or when the crystal is doped with Si, and a B and/or S or a P-type dopant. Since Si provides low dislocation effects at a density which is approximately 1/10 that of In, doping with only a small amount of Si is required, and constitutional supercooling due to segregation seldom occurs during the fabrication of a crystal. Therefore, a high yield can be obtained for a P-type GaAs single crystal which has a low dislocation density.

Compared with conventional crystals, the thus obtained P-type GaAs single crystals and P-type GaAs single crystal wafers have low dislocation densities of 500 $cm^{-2}$, or particularly, of lower than 400 $cm^{-2}$. When such a semiconductor wafer is employed as a compound semiconductor laser wafer, a laser having high light emission efficiency and a long service life can be obtained.

Embodiment 1

As is shown in FIG. 1, a GaAs seed crystal (3) was loaded at the bottom of a pBN (thermally decomposed boron nitride) crucible (1) having a 3-inch diameter, and 4000 grams of GaAs polycrystal (4) and 50 grams of $B_2O_3$ (5) were loaded above it. Then, 1.5 grams of Zn (6) and 0.5 gram of Si (7) were added, and in a vacuum the crucible (1) was sealed inside a quartz ampoule (2).

The quartz ampoule (2) was inserted into a growth furnace where it was heated by a heater (8), and seeding occurred when the GaAs polycrystal (4) and a part of the seed crystal (3) were melted. The quartz ampoule (2) was cooled while a temperature gradient of from 3 to 5° C./cm was maintained, and a GaAs single crystal was obtained.

The single crystal was sliced, and a 3-inch GaAs wafer, having the area of 45 $cm^2$ for one face and a crystal face (100), was obtained for which melt-KOH etching was performed for thirty minutes. The dislocation density was then measured by observing the wafer using an optical microscope. The etched pits in a 1×1 mm area within the visual field of the microscope were counted, and the result was multiplied by 100 to obtain the dislocation density for 1 $cm^2$. Measurements were conducted at 37 locations at intervals of 10 mm to acquire the average dislocation density.

The average dislocation density was 180 $cm^{-2}$. The carrier concentration of the wafer was $1.2 \times 10^{19}$ $cm^{-3}$, which is indicative of a P-type conductive wafer. And the impurity densities, as determined when the wafer was measured using an SIMS, were those shown in the table of FIG. 2.

Five crystals were grown under the above described conditions, and all the obtained crystals were single crystals.

Embodiment 2

Figure 3:
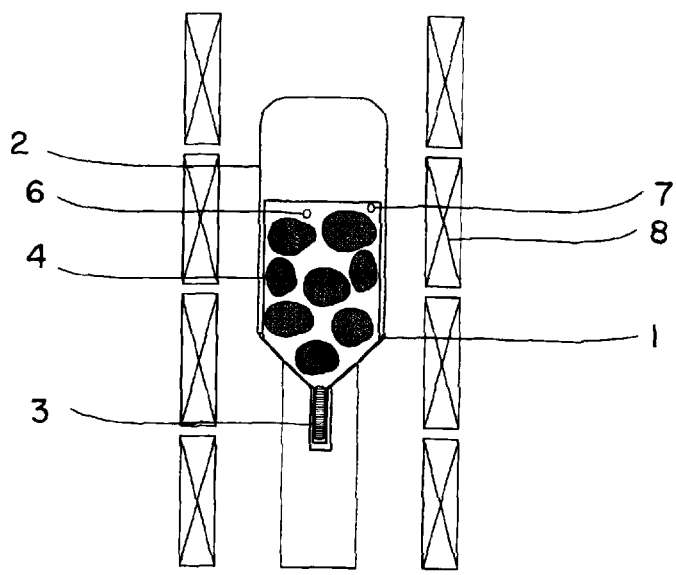
FIG. 3 is a schematic diagram illustrating an apparatus used to manufacture a single crystal according to a second embodiment of the present invention.

As is shown in FIG. 3, a GaAs seed crystal (3) was loaded at the bottom of a quartz crucible (1) having a 3 inch diameter, and 4000 grams of GaAs polycrystal (4) was loaded above it. Then, 1.5 grams of Zn (6) and 0.2 gram of Si (7) were added, and in a vacuum, the crucible (1) was sealed inside a quartz ampoule (2).

The quartz ampoule (2) was inserted into a growth furnace where it was heated by a heater (8), and seeding occurred when the GaAs polycrystal (4) and a part of the seed crystal (3) were melted. The quartz ampoule (2) was cooled while a temperature gradient of 3 to 5° C./cm was maintained, and a GaAs single crystal was obtained.

The single crystal was sliced, and a 3-inch GaAs wafer having a crystal face (100) was obtained for which melt-KOH etching was performed for thirty minutes. The dislocation density was then measured in the same manner as in Embodiment 1, and the average dislocation density was found to be 380 $cm^{-2}$.

The carrier concentration of the wafer was $1.5 \times 10^{19}$ $cm^{-3}$, which is indicative of a P-type conductive wafer. And the impurity densities, as determined when the wafer was measured using an SIMS, were those shown in the above table of FIG. 2.

Five crystals were grown under the conditions described above, and all the obtained crystals were single crystals.

Embodiment 3

Figure 4:
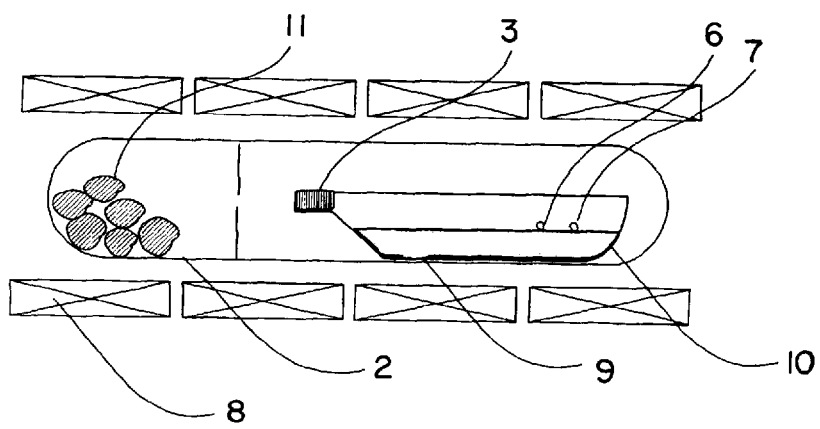
FIG. 4 is a schematic diagram illustrating an apparatus used to manufacture a single crystal according to a third embodiment of the present invention.

As is shown in FIG. 4, 2750 grams of Ga (9), 3.0 grams of Zn (6), and 0.2 gram of Si (7) were loaded in a horizontal quartz boat (10), at one end of which was disposed a GaAs seed crystal (3). In a vacuum, the quartz boat (10) and metal arsenic (11) were then sealed in a quartz ampoule (2).

The quartz ample (2) was inserted into a growth furnace where it was heated by a heater (8) to composite melt-GaAs, and seeding occurred when a part of the GaAs seed crystal (3) was melted. The quartz ampoule (2) was cooled while a temperature gradient of 0.5 to 3° C./cm was maintained, and a GaAs single crystal was obtained.

The single crystal was sliced and a 2-inch GaAs wafer having a face (100) was obtained for which melt-KOH etching was performed for thirty minutes. Then, the dislocation density was measured in the same manner as in Embodiment 1, except that measurements were conducted at 69 locations at intervals of 5 mm. The average dislocation density was 420 $cm^{-2}$.

The carrier concentration of the GaAs wafer was $2.1 \times 10^{19}$ $cm^{-3}$, which is indicative of a P-type conductivity. The impurity densities, as determined when the wafer was measured using an SIMS, were those shown in the table of FIG. 2. And when five crystals were grown under the conditions described above, all the obtained crystals were single crystals.

Comparison Example 1

Growing of a GaAs single crystal was performed in the same manner as in Embodiment 1, with the exception that 0.01 gram of Si was added. The dislocation density of the thus obtained GaAs wafer was measured under the same conditions as in Embodiment 1, and the average density in a plane was found to be 1810 $cm^{-2}$. The impurity densities, as determined when the wafer was measured using an SIMS, were those shown in the table of FIG. 2.

Comparison Example 2

Growing of a GaAs single crystal was performed five times in the same manner as in Embodiment 1, with the exception that 1.5 grams of Si were added. Many tiny deposits of substances were generated by impurities, and only one single crystal was obtained. The dislocation density of a GaAs wafer, which was obtained by cutting the single crystal that was produced, was measured under the same conditions as in Embodiment 1, and the average density in a plane was found to be 2840 $cm^{-2}$. The impurity densities, as determined when the wafer was measured using an SIMS, were those shown in the table of FIG. 2.

As is apparent from the Table 1, when the results obtained for Embodiments 1 to 3 of the present invention are compared with the results obtained for Comparison Examples 1 and 2, it is obvious that for a unit area an etch pit density which is equal to or lower than 500 $cm^{-2}$ can be obtained by using a combination of densities for Zn and Si, or for Zn and Si and B.

Figure 5:
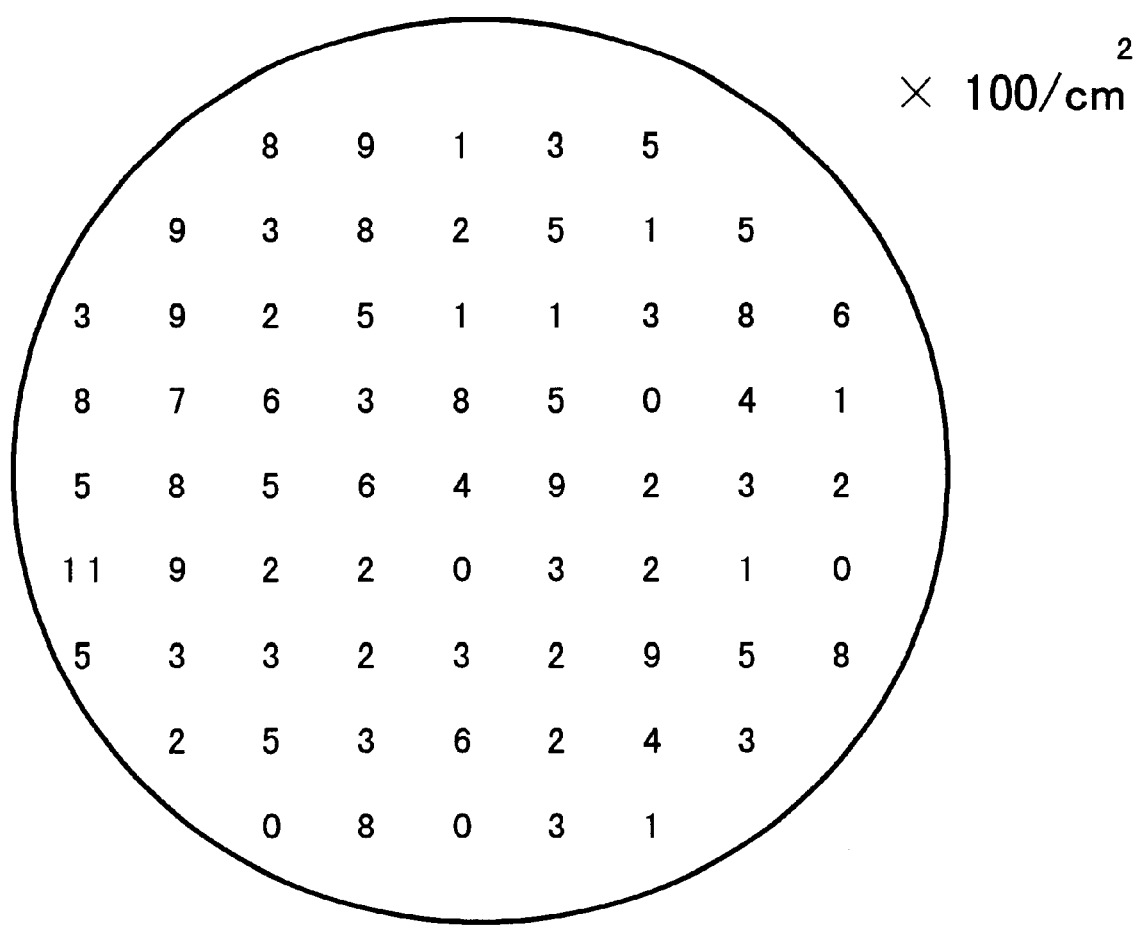
FIG. 5 is a diagram showing the etch pit density (EPD) distribution on a face (100) of a single crystal obtained by the present invention.

FIG. 5 is a diagram showing an example of the distribution on the face (100) of a single crystal of the etch pit densities (EPD) obtained by the present invention. It is obvious that the dislocation density at each point is smaller than the average dislocation density in Comparison Example 1 or 2.

As is described above in the embodiments, according to the present invention a P-type GaAs single crystal having a low dislocation density can be obtained by double doping with Si and a P-type dopant. As a result, a compound semiconductor laser or a light emitting diode having high efficiency and a long service life can be produced by using the thus obtained P-type GaAs single crystal semiconductor wafer.

In addition, the above described embodiments are intended only to explain the present invention, and the scope of the present invention is not restricted to the examples. Those equivalent to what is claimed should also be within the scope of the present invention.

What is claimed is:

1. A P-type GaAs single crystal comprising Si, a P-type dopant, and B, wherein said P-type indicative dopant has an atomic ratio relative to Si of from 1.5 to 200, and B has an atomic ratio relative to Si of from 0.001 to 1,000.

2. The P-type GaAs single crystal according to claim 1, wherein said P-type indicative dopant has an atomic ratio relative to Si of from 2 to 100.

3. The P-type GaAs single crystal according to claim 1, wherein the atomic concentration of Si ranges from $1\times10^{17}$ to $5\times10^{19}$ cm$^{-3}$.

4. The P-type GaAs single crystal according to claim 3, wherein the atomic concentration of Si ranges from $1\times10^{17}$ to $1\times10^{19}$ cm$^{-3}$.

5. The P-type GaAs single crystal according to claim 1, wherein the atomic concentration of the P-type indicative dopant ranges from $1.1\times10^{17}$ to $1\times10^{20}$ cm$^{-3}$.

6. The P-type GaAs single crystal according to claim 2, wherein the atomic concentration of the P-type indicative dopant ranges from $1.1\times10^{17}$ to $1\times10^{20}$ cm$^{-3}$.

7. The P-type GaAs single crystal according to claim 5, wherein the atomic concentration of the P-type indicative dopant ranges from $2\times10^{18}$ to $6\times10^{19}$ cm$^{-3}$.

8. The P-type GaAs single crystal according to claim 6, wherein the atomic concentration of the P-type indicative dopant ranges from $2\times10^{18}$ to $6\times10^{19}$ cm$^{-3}$.

9. The P-type GaAs single crystal according to claim 1, wherein said P-type indicative dopant is an element selected from among a group consisting of C, Be, Zn, Cd, Li, Ge, Au, Mn, Ag, Pb, Co, Ni, Cu and Fe.

10. The P-type GaAs single crystal according to claim 9, wherein said P-type dopant is Zn.

11. The P-type GaAs single crystal according to claim 1, wherein S is an additional dopant that has an atomic ratio relative to Si of from 0.001 to 1000.

12. The P-type GaAs single crystal according to claim 11, wherein the atomic concentration of S ranges from $1\times10^{17}$ to $1\times10^{20}$ cm$^{-3}$.

13. The P-type GaAs single crystal according to claim 1, wherein at least a part of Si is replaced by Se and/or Te.

14. The P-type GaAs single crystal according to claim 1, wherein a carrier concentration is from $1\times10^{18}$ to $5\times10^{19}$ cm$^{-3}$.

15. A P-type GaAs single crystal comprising Si, a P-type dopant, and B, wherein Si is contained as a dopant at an atomic concentration of from $1\times10^{17}$ to $1\times10^{19}$ cm$^{-3}$, the P-type dopant is contained at an atomic concentration of from $1\times10^{18}$ to $1\times10^{20}$ cm$^{-3}$, and B is contained at an atomic concentration of from $1\times10^{17}$ to $1\times10^{20}$ cm$^{-3}$.

16. The P-type GaAs single crystal according to claim 15, wherein Si is contained at an atomic concentration of from $1\times10^{17}$ to $1\times10^{19}$ cm$^{-3}$, and Zn is contained as a P-type dopant at an atomic concentration of from $2\times10^{18}$ to $6\times10^{19}$ cm$^{-3}$.

17. The P-type GaAs single crystal according to claim 15, wherein said P-type dopant is an element selected from among a group consisting of C, Be, Zn, Cd, Li, Ge, Au, Mn, Ag, Pb, Co, Ni, Cu and Fe.

18. The P-type GaAs single crystal according to claim 17, wherein said P-type dopant is Zn.

19. The P-type GaAs single crystal according to claim 15, wherein S is contained as an additional dopant at an atomic concentration of from $1\times10^{17}$ to $1\times10^{20}$ cm$^{-3}$.

20. The P-type GaAs single crystal according to claim 15, wherein at least a part of said Si is replaced by Se and/or Te.

21. The P-type GaAs single crystal according to claim 15, wherein a carrier concentration is from $1\times10^{18}$ to $5\times10^{19}$ cm$^{-3}$.

22. A light-emitting diode comprising a P-type GaAs single crystal according to claim 1.

23. A compound semiconductor laser comprising a P-type GaAs single crystal according to claim 1.

* * * * *